United States Patent
Assmann et al.

(12) 
(10) Patent No.: US 7,336,072 B2
(45) Date of Patent: Feb. 26, 2008

(54) METHOD FOR REPRESENTATION OF FLOW IN A MAGNETIC RESONANCE IMAGE

(75) Inventors: Stefan Assmann, Erlangen (DE); Oliver Schreck, Bamberg (DE)

(73) Assignee: Siemens Aktiengesellschaft, Munich (DE)

( * ) Notice: Subject to any disclaimer, the term of this patent is extended or adjusted under 35 U.S.C. 154(b) by 162 days.

(21) Appl. No.: 11/361,443

(22) Filed: Feb. 24, 2006

(65) Prior Publication Data
US 2006/0241389 A1  Oct. 26, 2006

(30) Foreign Application Priority Data
Feb. 25, 2005  (DE) ...................... 10 2005 008 753

(51) Int. Cl.
*G01V 3/00* (2006.01)
(52) U.S. Cl. ....................................... 324/306; 324/309
(58) Field of Classification Search ........ 324/300–322; 600/407–445
See application file for complete search history.

(56) References Cited

U.S. PATENT DOCUMENTS

| | | | |
|---|---|---|---|
| 4,609,872 A | | 9/1986 | O'Donnell |
| 4,683,431 A | * | 7/1987 | Pattany et al. ............... 324/306 |
| 4,689,560 A | * | 8/1987 | Nayler et al. ................ 324/306 |
| 5,436,562 A | | 7/1995 | Bumoulin |
| 6,150,814 A | * | 11/2000 | Redpath et al. ............. 324/307 |
| 6,438,404 B1 | * | 8/2002 | Van Den Brink et al. .. 600/419 |
| 2004/0189297 A1 | | 9/2004 | Bock et al. |

OTHER PUBLICATIONS

"Regularization of Flow Streamlines in Multislice Phase-Contrast MR Imaging," Fatouraee et al, IEEE Trans. on Medical Imaging, vol. 22, No. 6, Jun. 2003, pp. 699-709.
"Analysis of Flow Patterns Using MRI," Buonocore et al, Inc. J. of Cardiac imaging, vol. 15 (1999) pp. 99-103.
"Handbook of MRI Pulse Sequences," Bernstein et al (2004) pp. 558-567 and 659-678.

* cited by examiner

*Primary Examiner*—Brij Shrivastav
(74) *Attorney, Agent, or Firm*—Schiff Hardin LLP

(57) ABSTRACT

In a method for representation of flow in a magnetic resonance image, a first magnetic resonance image of an examination subject is acquired, wherein the flow occurring in the examination subject is not compensated in a first spatial direction; a second magnetic resonance image is acquired, wherein the flow occurring in the first spatial direction is compensated, the phase of the magnetization in each of the first and the second magnetic resonance images is calculated of the phase difference between the first phase image and the second phase image, which is calculated is a measure for the flow along the first spatial direction. A third magnetic resonance image is acquired, wherein the flow in a second spatial direction perpendicular to the first spatial direction is not compensated, and a fourth magnetic resonance image is acquired, wherein the flow occurring in the second spatial direction is compensated. The phase in each of the third and fourth magnetic resonance images is calculated and the phase difference between the third and fourth phase images is calculated, which is a measure of the flow along the second spatial direction. A resulting flow velocity vector is calculated by vectorial addition of both flow components, and is visually represented.

11 Claims, 3 Drawing Sheets

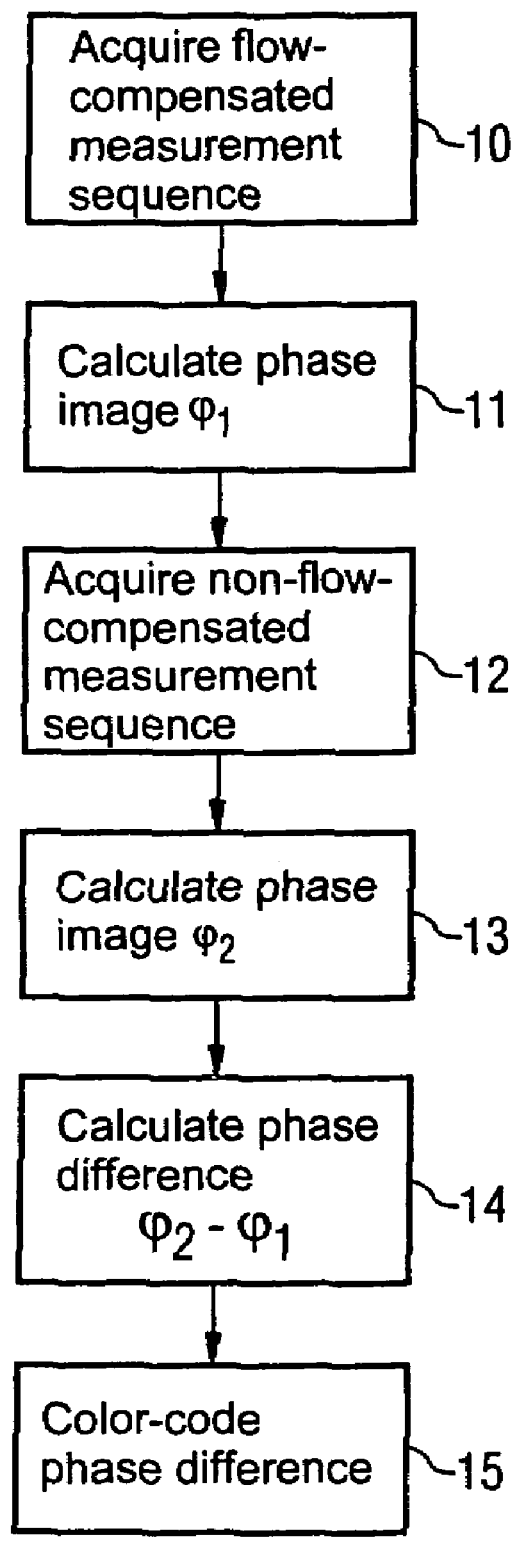

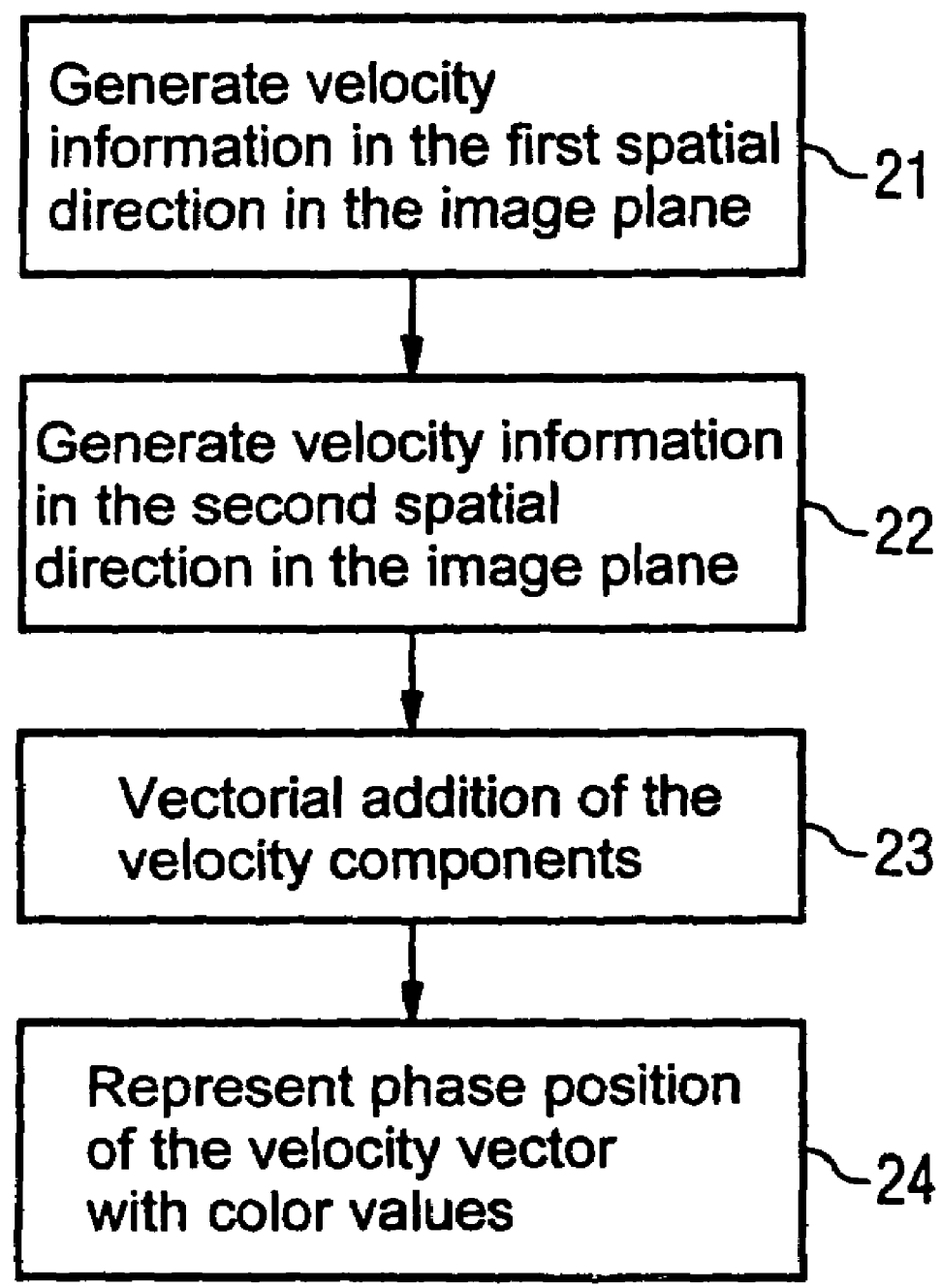

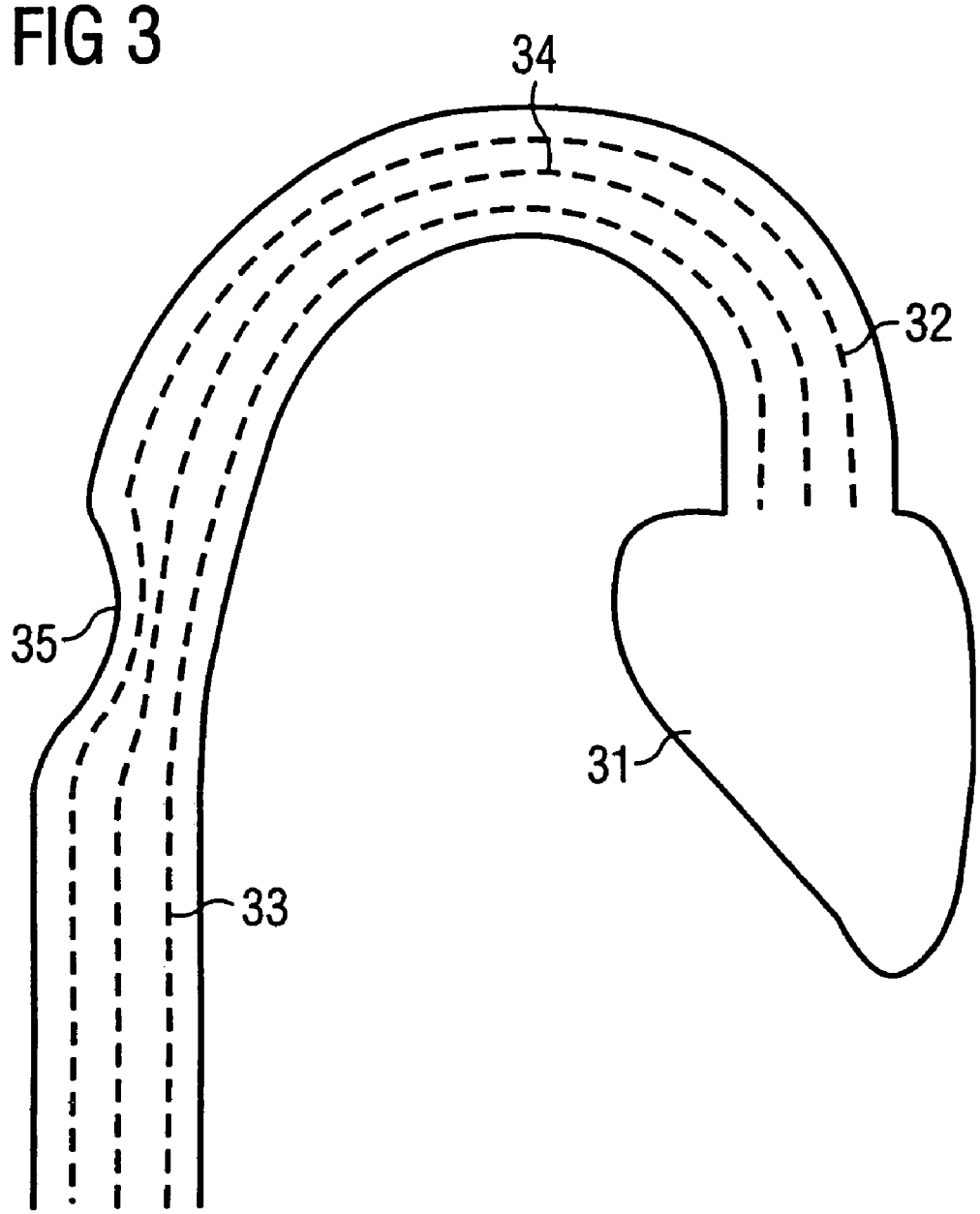

METHOD FOR REPRESENTATION OF FLOW IN A MAGNETIC RESONANCE IMAGE

BACKGROUND OF THE INVENTION

1. Field of the Invention

The present invention concerns a method for representation of flow in a magnetic resonance image.

2. Description of the Prior Art

It is well known that magnetic resonance imaging is sensitive to movement in the examination subject, such as, for example, blood flow in the human body. Due to the better understanding of the effects that occur in the MR imaging and their influence on the MR image, it would be possible to develop imaging techniques that are based on signal changes that are induced by moving spins in order to represent flow in the MR image.

The effects that occur are what are known as time of flight effects and phase effects. The time of flight effects are based on the fact that, in the imaging, new spins flow into the image plane that produce a different signal in the signal readout than the spins that were previously excited in the image plane with a radio-frequency pulse.

The representation of flow effects in the MR image due to the phase effect are based on the fact that excited spins, i.e. spins with transverse magnetization, move along magnetic field gradients, whereas the phase of the moving spins changes dependent on the speed.

The above-described influences on the MR signal of the moving spins can be used in order to generate, for example, MR angiographies. Conventionally, only a conclusion about the level of the flow speed along one spatial direction (also opposite to this spatial direction) was possible. A conclusion about the flow direction that is not limited to one spatial direction has previously not been possible.

Furthermore, color Doppler ultrasound systems are known that are based on the fact that the ultrasound frequency between received and sent wave frequency depends on the relative speed between the transmitter and receiver. In the color Doppler ultrasound method, an overview of the flow speed and the flow direction can be quickly obtained by the color coding of the blood flow.

SUMMARY OF THE INVENTION

An object of the present invention is to provide a method for representation of flow with which improved information about the flow direction is obtained.

This object is achieved by a method according to the invention wherein a first magnetic resonance image of an examination subject is acquired, with the flow occurring in the examination subject in a first spatial direction not being compensated in this acquisition. This means that the influence by the blood flow on the detected signal (and thus on the MR image) is not compensated and the flow information is contained in the image. Furthermore, a second magnetic resonance image is acquired in which the flow occurring in the first spatial direction is compensated. In the acquisition of this further magnetic resonance image, the influence of the moving spins on the MR signal (and thus on the MR image) is compensated, i.e. the further MR image is acquired in a manner so that the MR signal does not depend on the flow speed. Furthermore, the phase position of the magnetization is calculated for the first magnetic resonance image and for the second magnetic resonance image. The phase difference between the first phase image and the second phase image is subsequently calculated. As mentioned above, the phase of the transverse magnetization that is used for acquisition of the MR image is influenced by the flow speed. By the formation of the phase difference between the flow-compensated phase image and the non-flow-compensated phase image, a measure is obtained of the flow speed since the flow speed in the first spatial direction is compensated in one image and not compensated in the other. The difference in the phase is a measure for the flow speeds along the first spatial direction. This can be either flow speed in the same direction of the first spatial direction or opposite to the first spatial direction.

Furthermore, a third magnetic resonance image is acquired, wherein the flow in a second spatial direction perpendicular to the first spatial direction is not compensated. A fourth magnetic resonance image is likewise acquired, wherein the flow occurring in the second direction is compensated. As in the first and second magnetic resonance images, the phase of the transverse magnetization is calculated in each of the third and fourth magnetic resonance images, such that the phase difference between the third and fourth magnetic resonance images can be subsequently calculated. This phase difference is then a measure for the magnitude and the direction of the flow along the second spatial direction perpendicular to the first spatial direction. Because the flow along the first spatial direction and along the spatial direction is now known, a resulting flow speed vector can be calculated by vectorial addition of both flow components. By coding the flow in two spatial directions perpendicular to one another, the speed vector and therewith the precise direction can be calculated in the plane that is defined by the first spatial direction and the second spatial direction. It is possible to determine the precise direction of the speed and the magnitude of the speed in both spatial directions.

The shown vectors preferably are superimposed on an anatomical MR image so that the diagnostician sees the blood flow situation in an anatomical context. By this representation, the observer can immediately make a conclusion about flow direction and the magnitude of the flow speed. Such a conclusion about both significant attributes of flow in an MR image (namely the magnitude of the speed and the direction) has previously not been possible in one image.

In a further preferred embodiment, flow-compensated and non-flow-compensated phase images can likewise be generated in the third remaining spatial direction perpendicular to the first two spatial directions, and the phase difference calculated as explained above. A conclusion about the flow speed in the third spatial direction is thereby possible, such that the position of the flow speed vector in three-dimensional space can be represented by vectorial addition. The flow situation, for example along a vessel, can therewith be shown given acquisition of a three-dimensional data set.

In a preferred embodiment, a non-flow-compensated gradient switching in the first data set is used in the non-flow-compensated magnetic resonance images. In contrast to this, in a preferred embodiment a flow-compensated gradient switching in the first spatial direction is used in the flow-compensated magnetic resonance image. The phase difference is a measure of the magnitude and the direction of the flow along this first spatial direction. As is known from the prior art, the switching of two equally large, bipolar gradients leads to a phase effect that is proportional to the speed of the moving spins. However, the gradient switching can be altered such that the phase is independent of the flow speed (for example by a triple switching). The gradient with flow-compensated and non-flow-compensated switching preferably is used that is switched during the signal readout, i.e. during the readout gradient. The flow-compensated and non-flow-compensated gradient switching also can be used in the second spatial direction.

The regions in which flow occurs preferably are identified in the magnetic resonance image of the examination subject. The vectorial representation of the flow speeds can then be selected in these regions and the anatomical images can possibly be superimposed. Furthermore, in a preferred embodiment a magnitude image can be generated in which the magnitude difference between flow-compensated image and non-flow-compensated image is calculated. The phase difference is not considered in this magnitude image, but instead the signal intensity in the individual images. Through the difference of the non-flow-compensated image and the flow-compensated image, the magnitude image contains information as to where stationary tissue is located in the examination subject and where moving blood is located in the examination subject. This magnitude image can then be used to identify regions in which blood flows in the examination subject.

Furthermore, it is possible to use the phase image or the phase images themselves in order to identify the regions in the examination subject with flow therein. Naturally, it is possible to use the phase images and the magnitude images in order to definitively identify the regions in the examination subject in which flow occurs. It is likewise possible to use only one of the two images in order to identify the flow regions in which the flow behavior is then represented in color.

In a preferred embodiment, the first spatial direction along which the flow should be identified lies in the image plane, so that the flow speed components along this one direction in the image plane are known by the above phase difference formations. Furthermore, in the third and fourth magnetic resonance images the flow-compensated and non-flow-compensated gradient switching in the other spatial direction are situated in the image plane perpendicular to the first spatial direction. As described above, for this purpose the phase of the magnetization in the flow-compensated and non-flow-compensated MR images is likewise calculated and the phase difference is formed, the phase difference being a measure of the magnitude and the direction of the flow along the other spatial direction. The flow-compensated and non-flow-compensated gradient switching along the readout direction is frequently used. If the readout gradient and the phase coding gradient are now exchanged in the image plane, the velocity information is obtained along the other spatial direction in the in-the-image plane of the MR image.

Furthermore, it is possible to represent the phase position of the remaining resulting velocity vectors in color. If the phase of the velocity vector is represented in color, a predetermined color table can be used as is known, for example, from color Doppler ultrasound methods. In this case, for example, the phase values from 0 to 360° could be selected, from light blue over dark blue to black to red and yellow. Naturally, any other selection of the color table is possible in order to represent the phase values in color. If the color is used for information about the direction, for example, the length of the velocity vector can provide information about the magnitude of the flow speed. The length of the vector shown in the image point can be selected proportional to the magnitude of the flow speed for each image point or averaged over multiple image points, such that information about the direction can be obtained via the color and information about the magnitude of the flow speed can be discerned by the length of the vector.

The magnitude of the velocity vector also can be represented in color in another embodiment. For example, here the color table used in the color ultrasound can also be used. For example, blue values can be selected for low speeds and red to yellow values correspond to higher speeds. An image representing the flow speed can be acquired in a simple manner with the color coding of the magnitude of the speed vector. This is illustrated in an example. For blood vessels with a significantly curved (crooked) course, for example, with the use of color Doppler ultrasound methods one color (for example red) is obtained for the one direction and one other color (for example blue) is obtained for the other, opposite direction, although the magnitude of the flow speed is equally large. In a color Doppler ultrasound of the aorta, the ascending branch of the aorta would have a different color than the descending branch of the aorta due to the reversal of the flow speed. If the magnitude of the flow speed vector is now represented in color, the blood flow through the aortic arch would, for example, be uniformly shown with one color over the entire extent, assuming the magnitude of the flow speed does not change. In the case of a stenosis in the blood vessel, the magnitude of the flow speed changes due to the constriction. The stenosis can then be detected by the color representation of the magnitude.

In this case, the color coding provides the velocity information. The information about the direction can additionally be obtained by plotting the velocity vector, this indicating the direction information of the speed. In this manner it is possible to obtain velocity information, this information being the direction and the magnitude of the flow speed.

As results from the embodiments above, it is possible to obtain information about the magnitude of the flow speed, with one item of information being encoded in color and the other item of information being encoded by variation of the representation of the vector itself. If the magnitude of the vector is encoded in color, the vector itself shows the direction; if the direction of the vector is encoded in color, the magnitude of the flow speed can be represented encoded by the form (shape) of the vector.

Furthermore, the resulting velocity vector can be averaged over N image points of the magnetic resonance image, and an averaged velocity vector can be calculated for these N image points. For example, N can be between 4 and 20 and advantageously between 4 and 15 (approximately 8). For these N averaged image points, the average velocity vector provides information about the magnitude of the speed in these image points as well as information about the direction. A pattern like a flow path thus can be generated which shows the flow, in that, for example, a flow pattern can be generated for a vessel by merging N adjacent image points and an averaged velocity vector is calculated for these N adjacent image points. The intensity along a flow path then results from the sum of the intensities of the individual image points. For example, stenoses can be detected with this representation since the flow direction and the flow speed change at the stenosis.

In a further embodiment of the invention, the representation of the resulting velocity vector for an image point or for multiple averaged image points can be selected such that the length of the shown vector is a measure for the flow speed in the shown region. For example, the length of the vector can be selected proportional to the flow speed. If a number of image points are merged and a resulting velocity vector is calculated for these image points, the displayed length of the vector can be a measure for the magnitude of the flow speed.

In another embodiment, the line width (thickness) of the resulting velocity vector can also be a measure for the magnitude of the flow speed. For example, the line width of the displayed velocity vector can be proportional to the magnitude of the flow speed.

In both of the last exemplary embodiments, the magnitude of the velocity vector was made discernable by the representation of the geometry of the vector. In both cases, for example, the color coding can be used for the phase angle information of the vector.

DESCRIPTION OF THE DRAWINGS

FIG. 1 is a flow chart for a method for color representation of flow with coding along one spatial direction in accordance with the present invention.

FIG. 2 is a flow chart for a method for representation of the directional values of the velocity vectors in accordance with the present invention.

FIG. 3 shows a flow profile presentation obtained in accordance with the present invention, using the aortic arch as an example.

DESCRIPTION OF THE PREFERRED EMBODIMENTS

Basic steps for encoding the flow along one spatial direction in accordance with the inventive method are shown in FIG. 1. In a step 10, a flow-compensated measurement sequence of an examination subject is acquired, and the phase image for the flow-compensated measurement sequence is generated in a step 11. The acquisition of an MR image with flow-compensated measurement sequence is known to those skilled in the art; for example, this can be done using a readout gradient by switching of three opposing (opposite polarity) gradients. Furthermore, a non-flow-compensated measurement sequence is acquired in a step 12, and the phase image of the non-flow-compensated measurement sequence is calculated in a step 13. Given the use of a bipolar gradient in the readout direction, the phase position is directly proportional to the speed of the flow (or any moving item in the imaged region), so that the phase image calculated in the step 13 contains velocity information. Naturally, ECG triggering can be used in the acquisition of the flow-compensated sequence and in the acquisition of the non-flow-compensated sequence, i.e. the image acquisition is synchronized with the heartbeat. The flow-compensated measurement and the non-flow-compensated measurement need not be acquired in their entirety in succession, but rather data for the respective images can be acquired in an interleaved manner. The MR image would then be measured in series with flow compensation and without flow compensation for each Fourier line in the image acquisition. Possible patient imagings and the artifacts thereby generated can be minimized in the subsequent subtraction of the images. ECG triggering of the image acquisition can be necessary in order to take into account the influence of the heartbeat (i.e. of the pulsing blood flow) in the acquisition of the flow-compensated image and the non-flow-compensated image.

Lastly, the phase difference between the flow-compensated phase image and the non-flow-compensated phase image is calculated for each image point in step 14. These phase differences can be optionally represented color-coded in a step 15, whereby information about the direction and the magnitude of the flow speed in this direction is discernable by the color representation.

Since speeds are encoded by phase angles in this technique, and only a limited definition range from 0° to 360°, or from −180° to +180°, is available for this purpose, phase ambiguities must be avoided. The maximum speed that can be mapped without ambiguity depends on the strength of the flow-coded gradient and on the switching time thereof. These quantities must be selected such that the maximum speed occurring in the image can be mapped. For this purpose, the approximate speed in the measurement region preferably should be known before the measurement. If this is known, the gradient field strength and the switching times can then be applied such that the occurring speeds are unambiguously represented in phase, and thus in color values.

The basic steps to generate a velocity vector are depicted in FIG. 2.

Velocity information in a first spatial direction of the image plane is generated in a first step 21, as shown in connection with FIG. 1 in the steps 10 through 14. For step 21, a flow-compensated phase image and a non-flow-compensated phase image are generated and the phase difference is calculated, the phase difference being proportional to the flow speed. In step 21, the flow speed information is obtained along the spatial direction along which the flow-compensated gradient and the non-flow-compensated gradient were switched, this gradient lying in the image plane of the MR image in a step 21. In a step 22, velocity information is now generated for the second spatial direction that is perpendicular to the first spatial direction in the image plane. For example, the phase coding gradient and the readout gradient can be exchanged for this, such that the readout gradient is situated in the second spatial direction in which the phase coding gradient was previously applied in step 21. The respective directions of the phase coding gradients and the readout gradients were exchanged. Velocity information along the other, second spatial direction in the image plane perpendicular to the first spatial direction is thereby obtained by the phase difference. Using both of these components of directional information, a velocity vector can be subsequently generated in step 23 by addition of both components, so a velocity vector is generated for each image point in the MR image. In step 24, the phase position of the calculated velocity vector from step 23 can then be encoded with color values, such that an overview of the flow direction in the image plane can be discerned by the color representation.

Optionally, instead of step 24 it is possible to calculate an averaged velocity vector for a number of image points, by averaging the resulting velocity vector of each image point is averaged over multiple image points, for example an averaging of 4 to 20 image points. Flow paths or flow patterns within a vessel then can be determined from the magnitude and the direction of the resulting averaged velocity vector.

Instead of representing the phase of the velocity vector with color values in step 24, it is also possible to represent the magnitude of the velocity vector with color values. For example, the direction of the flow speed can be represented by plotting the velocity vector with or without an arrowhead. Given representation of the phase of the velocity vector with color values, a representation of the magnitude of the speed can be made by variation of the geometry of the vector itself, for example by changing the length of the displayed vector or by changing the thickness of the displayed vector.

FIG. 3 shows an example of how the flow speed information is superimposed with an anatomical image in order to give the diagnostician an overview as to the flow direction and the flow speed in the examination subject.

A flow pattern that is shown superimposed on an anatomical image is shown in FIG. 3. In the illustrated case, this is schematically the aortic arch exiting from the heart. Schematically shown in FIG. 3 are the heart 31, the ascending branch 32 of the aorta connected thereto and the descending branch 33 of the aorta.

The flow information is shown superimposed on the anatomical image in FIG. 3. For this purpose, the regions in the acquired MR image that contain flow must be identified. For example, a mask can be generated that is placed over the image, this mask containing information as to where blood flow has occurred in the image and where it has not. With this mask it is then possible to superimpose the flow information on the anatomical information. For detection of the regions in an image with flow, the phase image itself can be used, but it is also possible to use what is known as a magnitude image. For example, when the phase image is used in order to identify the regions with flow, profile filters can be used in which the phase values are considered in relation to other phase values in direct proximity. These profile filters are known in the art and need not be explained in detail herein. The magnitude image of the magnetization likewise can be used in order to identify regions in the image with flow. Furthermore, the phase images and the magnitude images can be used in combination in order to generate a mask that separates the regions with flow from the regions without flow in the MR image.

The flow profile in the aortic arch is shown in the example shown in FIG. 3. For this purpose, a resulting velocity vector is determined for a predetermined number of image points. The vectors 34 are shown without arrowheads for clarity. In the present case, the vectors 34 provide only information about the direction of the flow speed by their position in the image. As can be seen in FIG. 3, the flow in the entire aortic arch can be discerned in this manner. Information about the magnitude of the flow can be optionally simultaneously underlaid in color, by the magnitude of the speed being calculated and shown encoded in color values for each image point or averaged for a number of image points. In this case, the stenosis (schematically depicted in FIG. 3) can be detected since not only the direction of the flow changes here, but also the direction of the flow lines or vectors changes. When the magnitude of the speed is additionally represented in color, the increase in speed at the stenosis 35 can be detected by a color change of the blood flow. In the remainder of the aortic arch, given color representation of the flow speed, the speed would be approximately constant and would thus be represented uniformly in color up to the region of the stenosis 35. It would likewise be possible to encode the velocity information in the line thickness of the displayed vectors or in the length of the displayed vectors when no color representation is used or can be used.

In another embodiment, the phase (i.e. the direction) is represented in color and the magnitude of the velocity is encoded by the changes in the representation of the vector.

In the representation of vectors, for clarity an averaging over multiple image points can be affected transverse to the flow direction, such that vectors do not have to be plotted for each image point. A spacing corresponding to at least one image point or two image points should be left between two plotted vectors so that a line pattern of the flow is recognizable for the observer.

Naturally, the present invention offers many other application fields in the human body. One advantage of the inventive method is that the anatomy can be recognized very well simultaneously with the flow representation, which is not possible in a simple manner in the case of a color Doppler ultrasound measurement.

The methods described in FIG. 1 through 3 can also be arbitrarily combined with one another.

In summary, the invention offers a method that enables the diagnostician to receive an overview of the flow direction and the flow speed in a simple manner.

Although modifications and changes may be suggested by those skilled in the art, it is the intention of the inventor to embody within the patent warranted hereon all changes and modifications as reasonably and properly come within the scope of his contribution to the art.

We claim as our invention:

1. A method for representing flow within an examination subject in a magnetic resonance image of the examination subject, comprising the steps of:

acquiring a first magnetic resonance image of an examination subject having a fluid flow therein, without compensating said flow in a first spatial direction;

acquiring a second magnetic resonance image of the examination subject, with compensation of said flow in said first spatial direction, each of said first and second magnetic resonance images embodying data representing a magnetization having a phase;

automatically electronically calculating the phase of the magnetization in each of the first and second magnetic resonance images to produce a first phase image and a second phase image, and automatically calculating the phase difference between the first phase image and the second phase image as a measure of said flow in said first spatial direction;

acquiring a third magnetic resonance image of the examination subject without compensation of said flow in a second spatial direction perpendicular to said first spatial direction;

acquiring a fourth magnetic resonance image of the examination subject with compensation of said flow in said second spatial direction, each of said third and fourth magnetic resonance images containing data representing a magnetization having a phase;

automatically electronically calculating the phase of the magnetization in each of the third and fourth magnetic resonance images to obtain a third phase image and a fourth phase image, as well as calculated the phase difference between said third phase image and said fourth phase image as a measure of said flow in said second spatial direction; and automatically electronically calculating a resulting flow velocity vector by vectorial addition of said flow in said first spatial direction and said flow in said second spatial direction, and visually representing said resulting flow velocity vector.

2. A method as claimed in claim 1 comprising acquiring said first magnetic resonance image by applying a first gradient to the examination subject in said first spatial direction with non-flow-compensated switching of said first gradient, acquiring said second magnetic resonance image by applying a second gradient to said examination subject in said first spatial direction with flow-compensated switching of said second gradient, acquiring said third magnetic resonance image by applying a third gradient to the examination subject in said second direction with non-flow-compensated switching of said third gradient, and acquiring said fourth magnetic resonance image by applying a fourth gradient to the examination subject in said second spatial direction with flow-compensated switching of said fourth gradient, and wherein said phase difference between said first phase image and said second phase image represents the magnitude and the direction of said flow along said first spatial direction, and wherein said phase difference between said third phase image and said fourth phase image represents the magnitude and the direction of the flow along said second spatial direction.

3. A method as claimed in claim 1 comprising displaying a magnetic resonance image of the examination subject and identifying regions containing said flow in said magnetic resonance image of the examination subject.

4. A method as claimed in claim 3 comprising generating said magnetic resonance image of said examination subject as a magnitude difference image between a flow-compensated magnetic resonance image of the examination subject and a non-flow-compensated image of the magnetic resonance subject, said magnitude difference image indicating locations of stationary tissue in the examination subject and location where flowing blood, represented by said flow, exists.

5. A method as claimed in claim 4 comprising using said first, second, third, and fourth phase images to identify said flowing blood in said magnitude difference image.

6. A method as claimed in claim 1 wherein each of said first and second magnetic resonance images are acquired in an image plane with said first spatial direction lying in said image plane, and acquiring said third and fourth magnetic resonance images along said second spatial direction perpendicular to said first spatial direction in said image plane.

7. A method as claimed in claim 6 wherein the step of visually representing said resulting flow velocity vector comprises visually representing said resulting flow velocity vector with the phase thereof represented in color.

8. A method as claimed in claim 6 wherein the step of visually representing said resulting flow velocity vector comprises visually representing said resulting flow velocity vector with the magnitude thereof represented in color.

9. A method as claimed in claim 1 comprising automatically calculating said resulting flow velocity vector as an average velocity vector averaged over a plurality of image points.

10. A method as claimed in claim 1 wherein the step of visually representing said resulting flow velocity vector comprises visually representing said resulting flow velocity vector in a magnetic resonance image of the examination subject with a length of said resulting flow velocity vector being proportional to the magnitude of said flow.

11. A method as claimed in claim 1 wherein the step of visually representing said resulting flow velocity vector comprises visually representing said flow velocity vector in a magnetic resonance image of the examination subject as a line having a line width proportional to the magnitude of said flow.

* * * * *